United States Patent
Peng et al.

(10) Patent No.: US 6,791,891 B1
(45) Date of Patent: Sep. 14, 2004

(54) METHOD OF TESTING THE THIN OXIDE OF A SEMICONDUCTOR MEMORY CELL THAT USES BREAKDOWN VOLTAGE

(75) Inventors: Jack Zezhong Peng, San Jose, CA (US); Harry Shengwen Luan, Saratoga, CA (US); Jianguo Wang, Cupertino, CA (US); Zhongshan Liu, Plano, TX (US); David Fong, Cupertino, CA (US); Fei Ye, Cupertino, CA (US)

(73) Assignee: Kilopass Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/406,406

(22) Filed: Apr. 2, 2003

(51) Int. Cl.[7] .................................................. G11C 7/00
(52) U.S. Cl. ....................................... 365/201; 365/149
(58) Field of Search ................................ 365/201, 145, 365/149, 185.18, 185.24, 185.28, 189.01, 189.07; 714/718; 324/551, 719

(56) References Cited

U.S. PATENT DOCUMENTS

| | | |
|---|---|---|
| 3,634,929 A | 1/1972 | Yoshida et al. |
| 4,322,822 A | 3/1982 | McPherson |
| 4,488,262 A | 12/1984 | Basire et al. |
| 4,490,900 A | 1/1985 | Chiu |
| 4,502,208 A | 3/1985 | McPherson |
| 4,507,757 A | 3/1985 | McElroy |
| 4,543,594 A | 9/1985 | Mohsen et al. |
| 4,546,273 A | 10/1985 | Osman |
| 4,599,705 A | 7/1986 | Holmberg et al. |
| 4,613,886 A | 9/1986 | Chwang |
| 4,677,742 A | 7/1987 | Johnson |
| 4,758,986 A | 7/1988 | Kuo |
| 4,794,562 A | 12/1988 | Kato et al. |
| 4,823,181 A | 4/1989 | Mohsen et al. |

(List continued on next page.)

FOREIGN PATENT DOCUMENTS

| | | |
|---|---|---|
| EP | 0 295 935 A1 | 12/1988 |
| JP | 61292295 | 12/1986 |

OTHER PUBLICATIONS

Miranda, Enrique et al; Analytic Modeling of LEakage Current Through Multiple Breakdown Paths in SiO2 Films; 39th Annual International Reliability Physics Symposium; Orlando, FL 2001.

Lombardo, S. et al., Softening of Breakdown in Ultra–Thin Gate Oxide nMOSFET's at Low Inversion Layer Density; 39th Annual International Reliability Physics Symposium; Orlando, FL 2001.

Wu, E.W. et al; Voltage–Dependent Voltage–Acceleration of Oxide Breakdown for Ultra–Thin Oxides; IEEE, 2000.

Rasras, Mahmoud et al; Substrate Hole Current Origin After Oxide Breakdown; IEEE, 2000.

Sune, Jordi et al; Post Soft Breakdown Conduction in SiO2 Gate Oxides; IEEE, 2000.

DeGraaf, C., et al, A Novel High–Density Low–Cost Diode Programmable Read Only Memory, IEEE, 1996.

*Primary Examiner*—Gene N. Auduong
(74) *Attorney, Agent, or Firm*—Perkins Coie LLP

(57) ABSTRACT

A method of testing a memory cell is disclosed. The memory cell has a data storage element constructed around an ultra-thin dielectric, such as a gate oxide, which is used to store information by stressing the ultra-thin dielectric into breakdown (soft or hard breakdown) to set the leakage current level of the memory cell. In order to ensure that the gate oxide underlying the data storage elements are of sufficient quality for programming, the memory cells of a memory array may be tested by applying a voltage across the gate oxide of the data storage element and measuring the current flow. Resultant current flow outside of a predetermined range indicates a defective memory cell.

14 Claims, 13 Drawing Sheets

U.S. PATENT DOCUMENTS

| | | | | |
|---|---|---|---|---|
| 4,876,220 | A | 10/1989 | Mohsen et al. | |
| 4,899,205 | A | 2/1990 | Hamdy et al. | |
| 4,943,538 | A | 7/1990 | Mohsen et al. | |
| 4,962,342 | A | 10/1990 | Mead et al. | |
| 5,138,410 | A | 8/1992 | Takebuchi | |
| 5,150,179 | A | 9/1992 | Gill | |
| 5,303,185 | A | 4/1994 | Hazani | |
| 5,304,871 | A | 4/1994 | Dharmarajan et al. | |
| 5,323,342 | A | 6/1994 | Wada et al. | |
| 5,412,244 | A | 5/1995 | Hamdy et al. | |
| 5,477,499 | A | 12/1995 | Van Buskirk et al. | |
| 5,496,756 | A | 3/1996 | Sharma et al. | |
| 5,576,568 | A | 11/1996 | Kowshik | |
| 5,578,848 | A | 11/1996 | Kwong et al. | |
| 5,586,270 | A | 12/1996 | Rotier et al. | |
| 5,587,603 | A | 12/1996 | Kowshik | |
| 5,600,265 | A | 2/1997 | El Gamal et al. | |
| 5,650,336 | A * | 7/1997 | Eriguchi et al. | 324/719 |
| 5,675,541 | A | 10/1997 | Leterrier | |
| 5,675,547 | A | 10/1997 | Koga | |
| 5,745,417 | A | 4/1998 | Kobayashi et al. | |
| 5,825,200 | A | 10/1998 | Kolze | |
| 5,825,201 | A | 10/1998 | Kolze | |
| 5,880,512 | A | 3/1999 | Gordon et al. | |
| 5,909,049 | A | 6/1999 | McCollum | |
| 5,929,482 | A * | 7/1999 | Kawakami et al. | 257/328 |
| 5,986,931 | A | 11/1999 | Caywood | |
| 5,986,939 | A | 11/1999 | Yamada | |
| 6,016,268 | A | 1/2000 | Worley | |
| 6,034,893 | A | 3/2000 | Mehta | |
| 6,040,968 | A | 3/2000 | Duvvury et al. | |
| 6,047,243 | A * | 4/2000 | Bang et al. | 702/58 |
| 6,064,595 | A | 5/2000 | Logie et al. | |
| 6,077,719 | A * | 6/2000 | Koike | 438/17 |
| 6,084,428 | A | 7/2000 | Kolze et al. | |
| 6,097,077 | A | 8/2000 | Gordon et al. | |
| 6,157,568 | A | 12/2000 | Schmidt | |
| 6,166,954 | A | 12/2000 | Chern | |
| 6,198,652 | B1 * | 3/2001 | Kawakubo et al. | 365/145 |
| 6,214,666 | B1 | 4/2001 | Mehta | |
| 6,215,140 | B1 | 4/2001 | Reisinger et al. | |
| 6,218,274 | B1 | 4/2001 | Komatsu | |
| 6,232,631 | B1 | 5/2001 | Schmidt et al. | |
| 6,249,809 | B1 | 6/2001 | Bro | |
| 6,282,123 | B1 | 8/2001 | Mehta | |
| 6,294,809 | B1 | 9/2001 | Logie | |
| 6,297,103 | B1 | 10/2001 | Ahn et al. | |
| 6,304,666 | B1 | 10/2001 | Warren et al. | |
| 6,337,250 | B2 * | 1/2002 | Furuhata | 438/301 |
| 6,351,428 | B2 | 2/2002 | Forbes | |
| 6,421,293 | B1 | 7/2002 | Candelier et al. | |
| 6,431,456 | B2 | 8/2002 | Nishizawa et al. | |
| 6,456,535 | B2 | 9/2002 | Forbes et al. | |
| 6,459,634 | B1 * | 10/2002 | Sher | 365/201 |
| 6,556,481 | B1 | 4/2003 | Hsu et al. | |
| 6,602,729 | B2 * | 8/2003 | Lin | 438/17 |
| 6,700,151 | B2 * | 3/2004 | Peng | 257/298 |
| 2001/0003374 | A1 | 6/2001 | Bohmer et al. | |

* cited by examiner

| OPERATION | R/C SELECT STATUS | V ROW | V COLUMN | V SOURCE | V OXIDE | RESULT |
|---|---|---|---|---|---|---|
| PROGRAM | SR/SC | 2.5 | 8.0 | 0 | 8.0 | PROGRAM |
|  | SR/UC | 2.5 | 0 | 0 | 0 | NO CHANGE |
|  | UR/SC | 0 | 8.0 | 0 | <5 | NO CHANGE |
|  | UR/UC | 0 | 0 | 0 | 0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

| | OPERATION | R/C SELECT STATUS | V ROW | V COLUMN | V SOURCE | V OXIDE | RESULT |
|---|---|---|---|---|---|---|---|
| 901 → | PROGRAM | SR/SC | 7.0 | 7.0 | 0 | 6.6 | PROGRAM |
| 902 → | | SR/UC | 7.0 | 0 | 0 | 0 | NO CHANGE |
| 903 → | | UR/SC | 0 | 7.0 | 0 | <4.0 | NO CHANGE |
| 904 → | | UR/UC | 0 | 0 | 0 | 0 | NO CHANGE |
| 905 → | READ | SR/SC | 2.5 | 1.5 | 0 | | CURRENT SENSED |
| 906 → | | SR/UC | 2.5 | 0 | 0 | | NO CURRENT |
| 907 → | | UR/SC | 0 | 1.5 | 0 | | NO CURRENT |
| 908 → | | UR/UC | 0 | 0 | 0 | | NO CURRENT |

FIG. 9

| OPERATION | R/C SELECT STATUS | V ROW | V COLUMN | V SOURCE | V OXIDE | RESULT |
|---|---|---|---|---|---|---|
| PROGRAM | SR/SC | 2.5 | 2.5 | -4.5 | 6.6 | PROGRAM |
|  | SR/UC | 2.5 | 0 | -4.5 | 4.0 | NO CHANGE |
|  | UR/SC | 0 | 2.5 | -4.5 | <4.0 | NO CHANGE |
|  | UR/UC | 0 | 0 | -4.5 | <4.0 | NO CHANGE |
| READ | SR/SC | 2.5 | 1.5 | 0 |  | CURRENT SENSED |
|  | SR/UC | 2.5 | 0 | 0 |  | NO CURRENT |
|  | UR/SC | 0 | 1.5 | 0 |  | NO CURRENT |
|  | UR/UC | 0 | 0 | 0 |  | NO CURRENT |

METHOD OF TESTING THE THIN OXIDE OF A SEMICONDUCTOR MEMORY CELL THAT USES BREAKDOWN VOLTAGE

TECHNICAL FIELD OF THE INVENTION

The present invention relates to nonvolatile programmable semiconductor memory that utilizes the breakdown of thin oxide as the programming mechanism, and more particularly, to a method for determining the programming viability of the thin oxide for programming.

BACKGROUND OF THE INVENTION

Nonvolatile memory retains stored data when power is removed, which is desirable in many different types of electronic devices. One commonly available type of nonvolatile memory is the programmable read-only memory ("PROM"), which uses word line —bit line crosspoint elements such as fuses, anti-fuses, and trapped charge devices such as the floating gate avalanche injection metal oxide semiconductor ("FAMOS") transistor to store logical information.

Improvements in the various processes used for fabricating the various types of nonvolatile memory tend to lag improvements in widely used processes such as the advanced CMOS logic process. For example, processes for devices such as flash EEPROM devices tend to use 30% more mask steps than the standard advanced CMOS logic process to produce the various special regions and structures required for the high voltage generation circuits, the triple well, the floating gate, the ONO layers, and the special source and drain junctions typically found in such devices. Accordingly, processes for flash devices tend to be one or two generations behind the standard advanced CMOS logic process and about 30% more expensive on a cost-per-wafer basis. As another example, processes for antifuses must be suitable for fabricating various antifuse structures and high voltage circuits, and so also tend to be about one generation behind the standard advanced CMOS process.

Generally, great care is taken in the fabrication of the silicon dioxide layer used in metal-oxide-silicon (MOS) devices such as capacitors and transistors. The high degree of care is necessary to ensure that the silicon dioxide layer is not stressed during manufacture or subsequent normal operation of the integrated circuit, so that the desired device characteristics are attained and are stable over time. One example of how much care is taken during fabrication is disclosed in U.S. Pat. No. 5,241,200 to Kuroda, which discloses the use of a diffused layer and a shunt to discharge charges accumulated in the word line during a wafer fabrication process. Avoiding this charge accumulation ensures that a large electric field is not applied to the gate insulating film, so that variations in the characteristics of transistors using the word line as their gate wiring line and degradation and breakdown of the gate insulating film are prevented.

An example of how much care is taken in circuit design to avoid stressing the silicon dioxide layer of a transistor during normal circuit operation is disclosed in U.S. Pat. No. 6,249,472 to Tamura et al. Tamura et al. disclose an antifuse circuit having an antifuse in series with a p-channel MOS transistor in one embodiment and in series with an n-channel MOS transistor in another embodiment. While the antifuse is fabricated without the additional film manufacturing processes typically required for fabricating antifuse circuits, Tamura et al. poses another problem. When the antifuse is shorted out, the series-connected transistor is exposed to a high voltage sufficient to break down the silicon dioxide layer of the transistor. Tamura et al. disclose the addition of another transistor to the circuit to avoid exposing the first transistor to the break down potential.

The observations above generally indicate that there are still disadvantages with each of the prior art memory technologies. Even where new memory technologies are developed that traverse the disadvantages of previous memories, these new memory technologies may be slow in being adopted. One reason is that there is skepticism as to the quality of the memory cells. In particular, there is skepticism as to whether each cell can be reliably programmed.

BRIEF DESCRIPTION OF THE DRAWINGS

FIG. 8 is a table of voltages.

FIG. 9 is a table of voltages.

FIG. 10 is a table of voltages.

DETAILED DESCRIPTION

Figure 1:
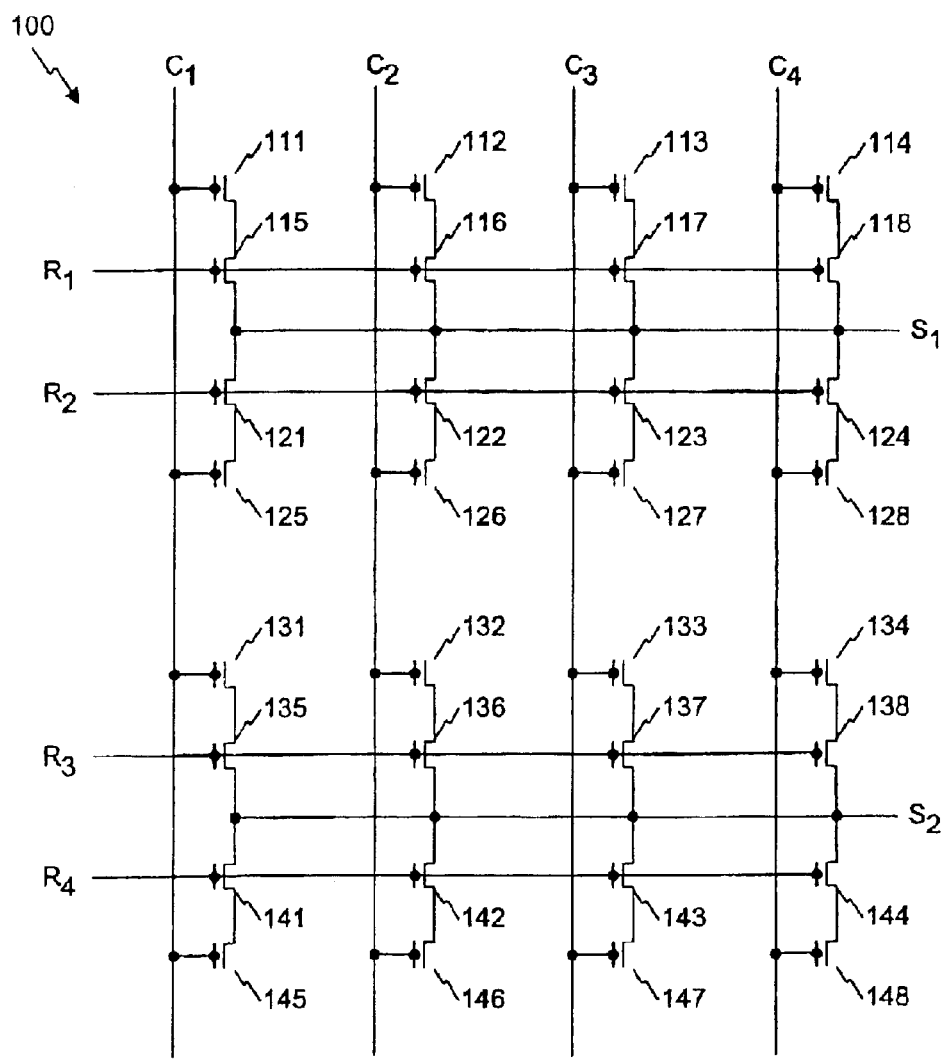
FIG. 1 is a schematic circuit diagram of a portion of a memory array in accordance with the present invention.

Recently, the assignee of the present invention has developed a family of semiconductor memory cells and arrays that is compatible with a single polysilicon logic process. The memory cells and arrays are based upon the breakdown of a thin oxide layer. Details of the memory cells and arrays are described in U.S. patent application Ser. No. 09/955,641 filed on Sep. 18, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 10/024,327 filed on Dec. 17, 2001 entitled "SEMICONDUCTOR MEMORY CELL AND MEMORY ARRAY USING A BREAKDOWN PHENOMENA IN AN ULTRA-THIN DIELECTRIC", U.S. patent application Ser. No. 09/982,034 filed on Oct. 17, 2001 entitled "SMART CARD HAVING NON-VOLATILE MEMORY FORMED FROM LOGIC PROCESS", U.S. patent application Ser. No. 09/982,314 filed on Oct. 17, 2001 entitled "REPROGRAMMABLE NON-VOLATILE OXIDE MEMORY FORMED FROM LOGIC PROCESS", and U.S. patent application Ser. No. 10/133,704 filed on Apr. 26, 2002 entitled "HIGH DEN- SITY SEMICONDUCTOR MEMORY CELL AND MEMORY ARRAY USING A SINGLE TRANSISTOR", each of which is hereby incorporated by reference in their entirety.

For the sake of completeness, one example of a memory cell suitable for use with the present invention is described below. It must be appreciated that other types of memory cells may also be tested using the method of the present invention and that the memory cell described below is merely one example. In general, the semiconductor memory cell has a data storage element constructed around an ultra-thin dielectric, such as a gate oxide. The data storage element is used to store information by stressing the ultra-thin dielectric into breakdown (soft or hard breakdown) to set the leakage current level of the memory cell. The memory cell is read by sensing the current drawn by the cell. A suitable ultra-thin dielectric is, for example, high quality gate oxide of about 50 Å thickness or less, as is commonly available from presently available advanced CMOS logic processes, for example. Such oxides are commonly formed by deposition, by oxide growth from a silicon active region, or by some combination thereof. Other suitable dielectrics include oxide-nitride-oxide composites, compound oxides, and so forth.

In the following description, numerous specific details are provided to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The Memory Cell and Array

An example of an arbitrary 4 by 4 portion of a memory array 100 that includes several such memory cells is shown in the schematic diagram of FIG. 1. FIG. 1 shows 16 memory cells, each of which includes a MOS transistor and a MOS half-transistor. The memory cell at, for example, the crosspoint of the first row $R_1$ and the first column $C_1$ includes an n-channel MOS transistor 115 having its gate connected to the row line $R_1$, its source connected to a source line $S_1$, and its drain connected to one terminal of a MOS half-transistor 111.

The MOS transistor 115 is also referred to herein as a select transistor and is used to "select" a particular memory cell for programming or reading. As will be seen below, during the programming step, a large voltage is applied to the select transistor and MOS half-transistor 111 to break down the gate oxide of the MOS half-transistor 111. However, it is undesirable to break down the gate oxide of the select transistor. Therefore, the gate oxide of the select transistor may be made, in some alternative embodiments, to have a thicker gate oxide than that of the MOS half-transistor 111. Additionally or in the alternative, the select transistor may be replaced by an I/O device that is more resistant to break down.

The gate of the MOS half-transistor 111 is connected to the column line $C_1$. The other memory cells shown in FIG. 1 are formed from half-transistor-transistor pairs 112 and 116, 113 and 117, 114 and 118, 125 and 121, 126 and 122, 127 and 123, 128 and 124, 131 and 135, 132 and 136, 133 and 137, 134 and 138, 145 and 141, 146 and 142, 147 and 143, and 148 and 144.

A MOS half-transistor functions as follows. During programming or read, a positive voltage (for a p-type active region) is applied to the gate, which is one terminal of the capacitor. The gate acts as one plate of the capacitor and also causes an n-type inversion layer to form under the gate. The inversion layer acts as the other plate of the capacitor, and together with the source/drain region forms the second terminal of the capacitor.

The use of half-transistor type data storage elements in the array 100 of FIG. 1 is advantageous because the half-transistors can be fabricated using many conventional MOS and CMOS processes without adding any mask steps to them. However, other types of ultra-thin dielectric data storage elements may be used if desired. For example, a capacitor type data storage element advantageously may be programmed in either direction and has less resistance when the ultra-thin dielectric is stressed, but may require an additional masking step in some processes. Half-transistor type data storage elements are shown in cross-section in FIG. 3, while capacitor type data storage elements are shown in cross-section in FIG. 4.

Although only a 4 by 4 portion of the memory array 100 is shown, in practice such memory arrays contain on the order of about one gigabit of memory cells when fabricated using, for example, an advanced 0.13 $\mu$m CMOS logic process, and even larger memories will be realized as CMOS logic processes improve further. The memory 100 in practice is organized into bytes and pages and redundant rows (not shown), which may be done in any desired manner. Many suitable memory organizations are well known in the art.

Figure 2:
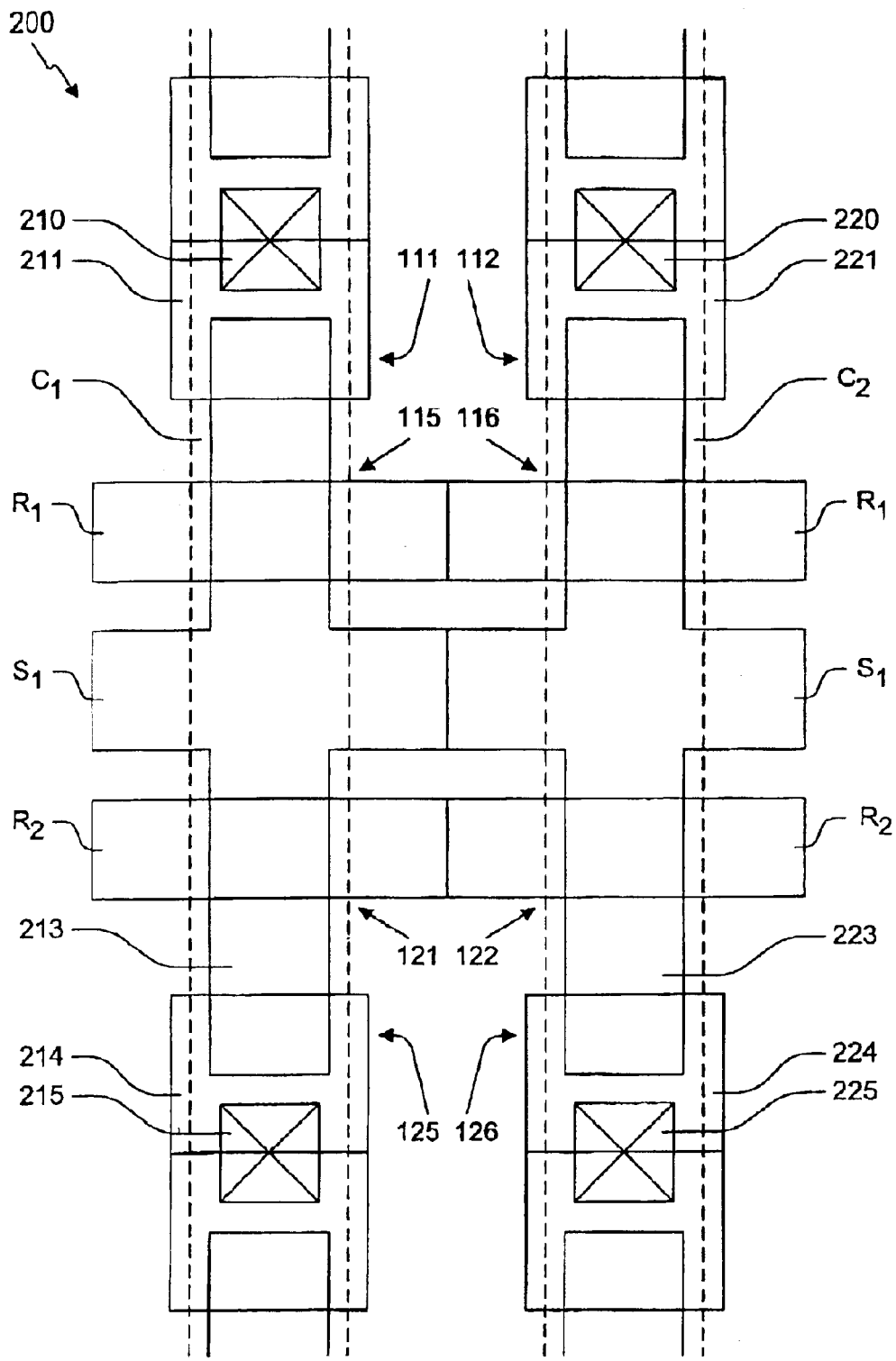
FIG. 2 is a partial layout diagram of a portion of the memory array represented by FIG. 1.
Figure 3:
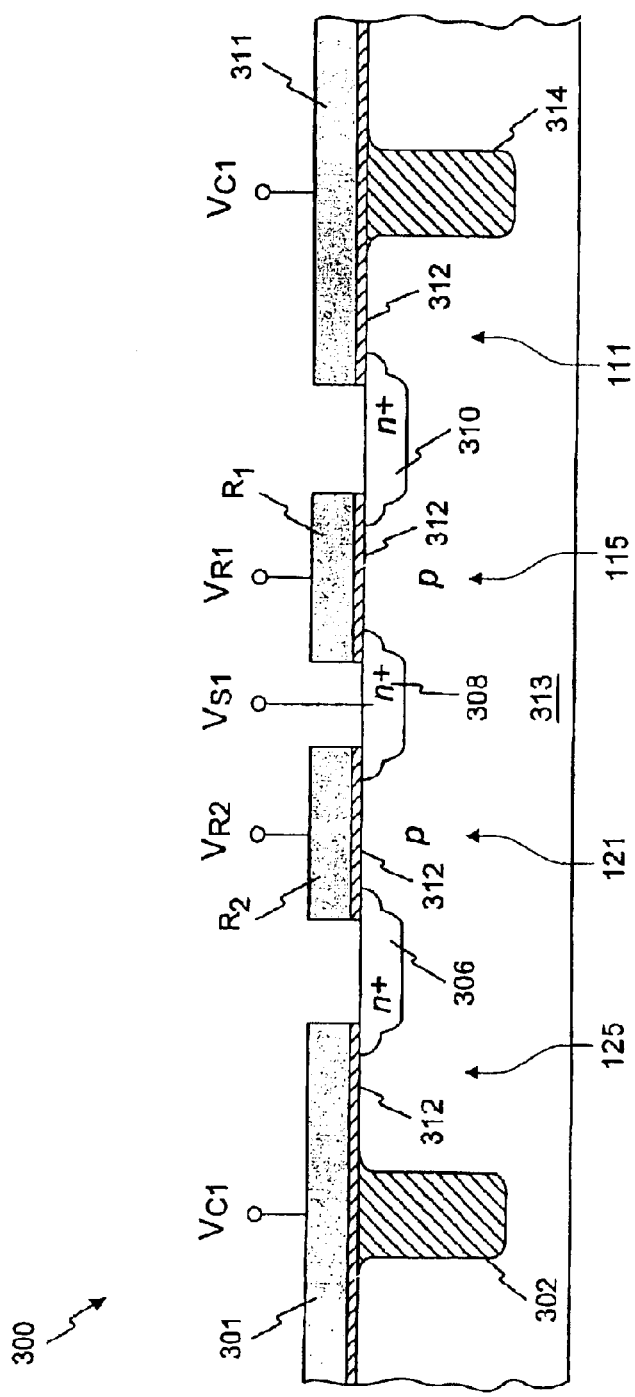
FIG. 3 is a cross-section diagram of an integrated circuit structure for the portion of the memory array corresponding to FIG. 2.

FIG. 2 shows a partial layout diagram 200 for a portion of the memory array 100, and FIG. 3 presents a cross-section of an illustrative MOS integrated circuit 300 showing the principal structure aspects thereof corresponding to the paired memory cells formed by transistor-half transistor pairs 115 and 111 and 121 and 125 in accordance with the layout diagram of FIG. 2. The layout diagram of FIG. 2 is suitable for an advanced CMOS logic process, for example. The term "MOS" literally means metal-oxide-silicon. Although the letter "M" stands for a "metal" gate structure and the letter "O" stands for oxide, the term MOS is commonly understood to pertain to any gate material, including doped polysilicon and other good conductors, as well as to various different types of gate dielectrics not limited to silicon dioxide, and the term is so used herein. For example, the dielectric may be any type of dielectric, such as an oxide or nitride, which undergoes a hard or soft breakdown upon the application of a voltage for a period of time. In one embodiment, a thermally grown gate silicon oxide of about 50 angstroms thick is used.

The memory array 100 preferably is laid out in a grid in which the column lines such as $C_1$ and $C_2$ are orthogonal to the row lines such as $R_1$, $R_2$, $R_3$ and $R_4$ as well as the diffused source lines. An active region mask, containing pattern 213 (FIG. 2), is used to form oxide isolation structures, which include oxide trenches 302 and 314 (FIG. 3), and to define the active regions such as 313 (FIG. 3), which will contain the various transistors, half-transistors, and diffused source lines of the memory array. The MOS half-transistor 111 and the MOS transistor 115 at the crosspoint of the row line $R_1$ and the column line $C_1$ and the MOS half-transistor 125 and the MOS transistor 121 at the crosspoint of the row line $R_2$ and the column line $C_1$ are formed in the p well active region 313 in the following manner.

An ultra-thin gate oxide layer 312 is formed followed by a deposition and doping of polysilicon, which is patterned using a gate mask containing patterns such as 211, 214, 221 and 224 for the gates 311 and 301 of half-transistor 111, 125 (as well as the gates (not shown) of half-transistors 112 and 126 and other half-transistors), and patterns such as $R_1$ and $R_2$ for the row lines $R_1$ and $R_2$, which also serve as gates for the select transistors 115, 121, 116 and 122 (as well as other select transistors). The various source and drain regions are formed by a lightly doped drain ("NLDD") process steps (implants, spacers, and n+ source/drain implants), creating the n+ regions 306, 308 and 310. The region 308 is also part of a diffused source line. A contact mask including patterns 210, 215, 220 and 225 (FIG. 2) is used to form contacts to the gates 301 and 311 (FIG. 3) and other gates (not shown). A metal mask includes dashed patterns labeled $C_1$ and $C_2$ (FIG. 2) for forming column lines such as $C_1$ and $C_2$, which are orthogonal to the polysilicon row lines such as $R_1$, $R_2$, $R_3$ and $R_4$ as well as the diffused source lines. The other transistor-half transistor pairs in the memory 100 are simultaneously formed in an identical manner.

Figure 4:
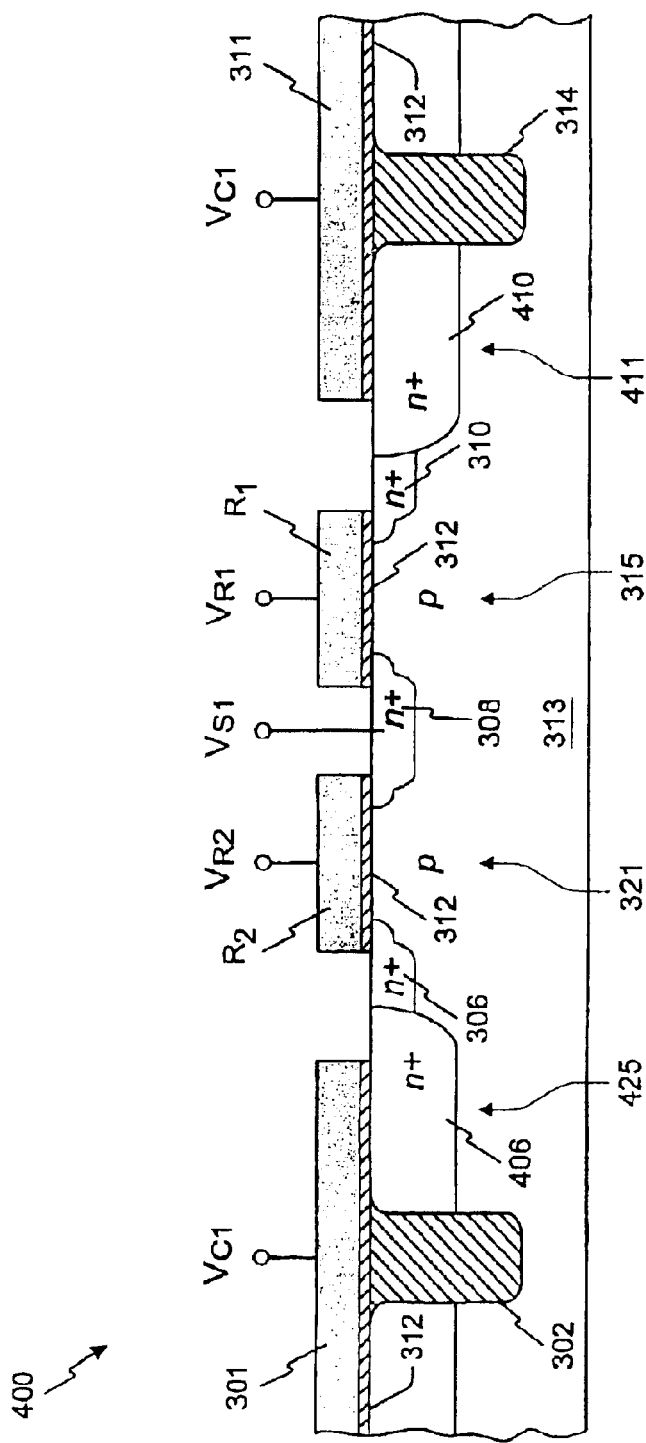
FIG. 4 is a cross-section diagram of a variation of the integrated circuit structure of FIG. 3.

FIG. 4 shows a cross-section of an illustrative MOS integrated circuit 400 showing the principal structural aspects thereof. The cross-section 400 is similar to the cross section 300 of FIG. 3 except that the half transistors 125 and 111 of FIG. 3 are replaced by another type of ultra-thin dielectric data storage element, namely capacitors 425 and 411. The capacitor 411 at the crosspoint of the row line $R_1$ and the column line $C_1$ is formed from the polysilicon gate 311, which is contacted by a metal contact defined by pattern 210, and which overlies the gate oxide 312 and a deeply diffused n+ region 410. Similarly, the MOS capacitor 425 at the crosspoint of the row line $R_2$ and the column line $C_1$ is formed from the polysilicon gate 301, which is contacted by a metal contact defined by the pattern 215, and which overlies the gate oxide 312 and a deeply diffused n+ region 406.

The n+ regions 406 and 410 allow the capacitors 425 and 411 to have very low resistance conductive states relative to the half-transistor 125 and 111 of FIG. 3, which rely on the setting up of an inversion layer to conduct current. Another advantage of the capacitors 425 and 411 is that they can be programmed by flowing current in either direction. A disadvantage of the capacitors 406 and 410 is that they generally require the modification of commercially available processes by the addition of a mask step and/or implantation steps. For example, suitable techniques for forming the n+ regions 406 and 410 include the use of buried n+ implants prior to the gate polysilicon deposition, or by side implant diffusion after the polysilicon deposition and etch. While the n+ regions 406 and 410 are shown to be more deeply diffused than the doped regions 306 and 310 with which they are integrated, the depth of the diffusion may be varied as desired.

Figure 5:
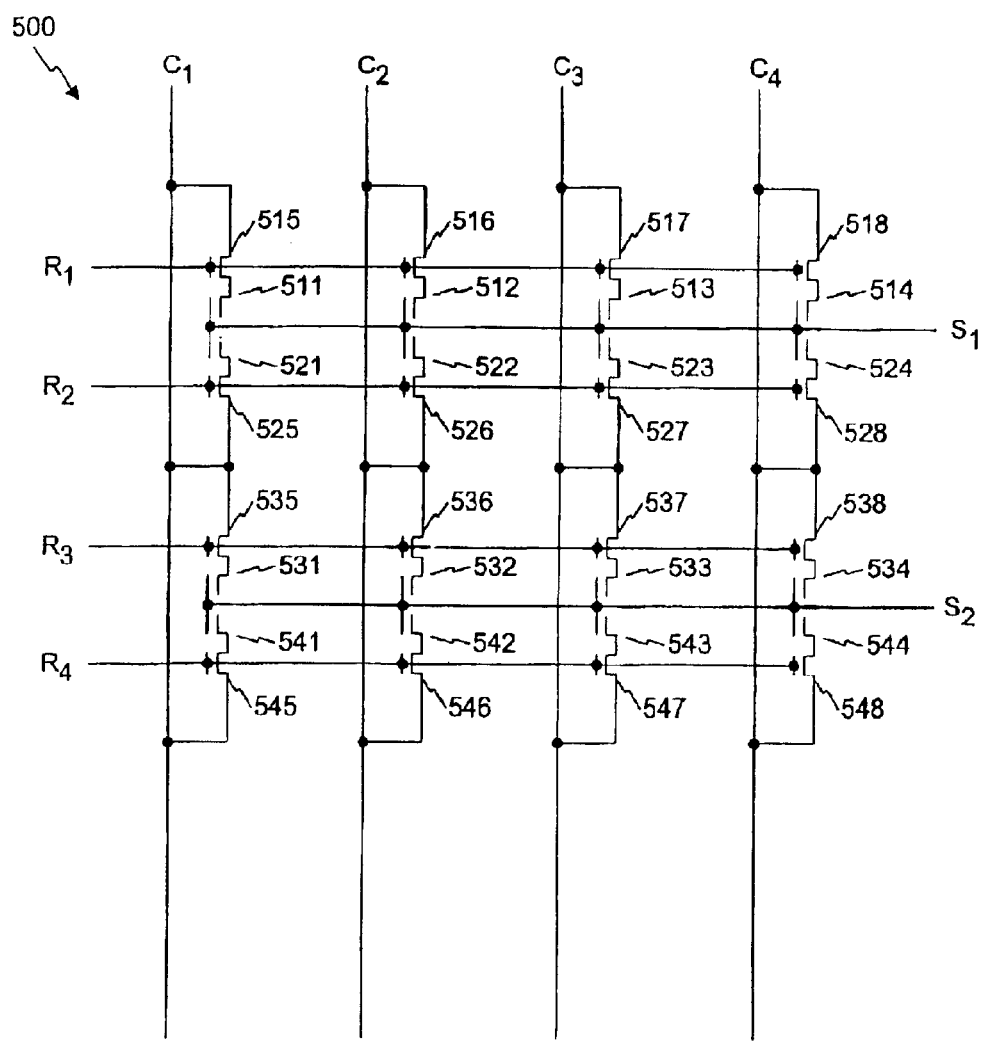
FIG. 5 is a schematic circuit diagram of a portion of another type of memory array in accordance with the present invention.

A variation of the memory array 100 is the memory array 500 shown in FIG. 5, which shows an arbitrary 4 by 4 portion of a larger memory array of memory cells, each of which includes a MOS transistor and a MOS half-transistor. The memory cell at, for example, the crosspoint of the first row $R_1$ and the first column $C_1$ includes a n-channel MOS transistor 515 having its gate connected to the row line $R_1$, its drain connected to the first column $C_1$, and its source connected to one terminal of a MOS half-transistor 511. The gate terminal of the MOS half-transistor 511 is connected to a source line $S_1$. The other memory cells shown in FIG. 1 are formed from similar half transistor—transistor pairs 512 and 516, 513 and 517, 514 and 518, 521 and 525, 522 and 526, 523 and 527, 524 and 528, 531 and 535, 532 and 536, 533 and 537, 534 and 538, 541 and 545, 542 and 546, 543 and 547, and 544 and 548.

As in the case of the memory array of FIG. 1, MOS capacitors may be used instead of MOS half-transistors in the memory array of FIG. 5.

Figure 6:
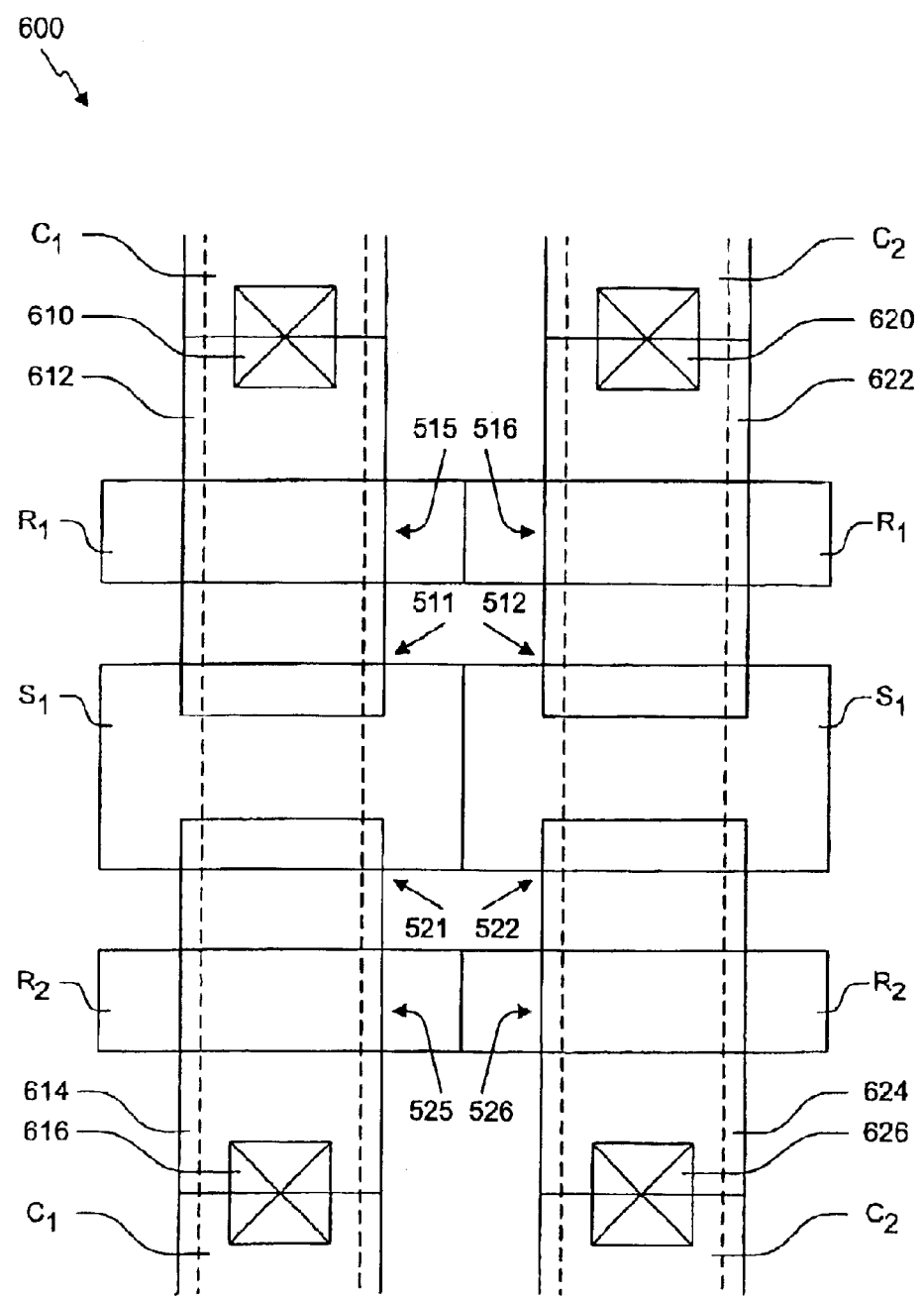
FIG. 6 is a partial layout diagram of a portion of the memory array represented by FIG. 5.
Figure 7:
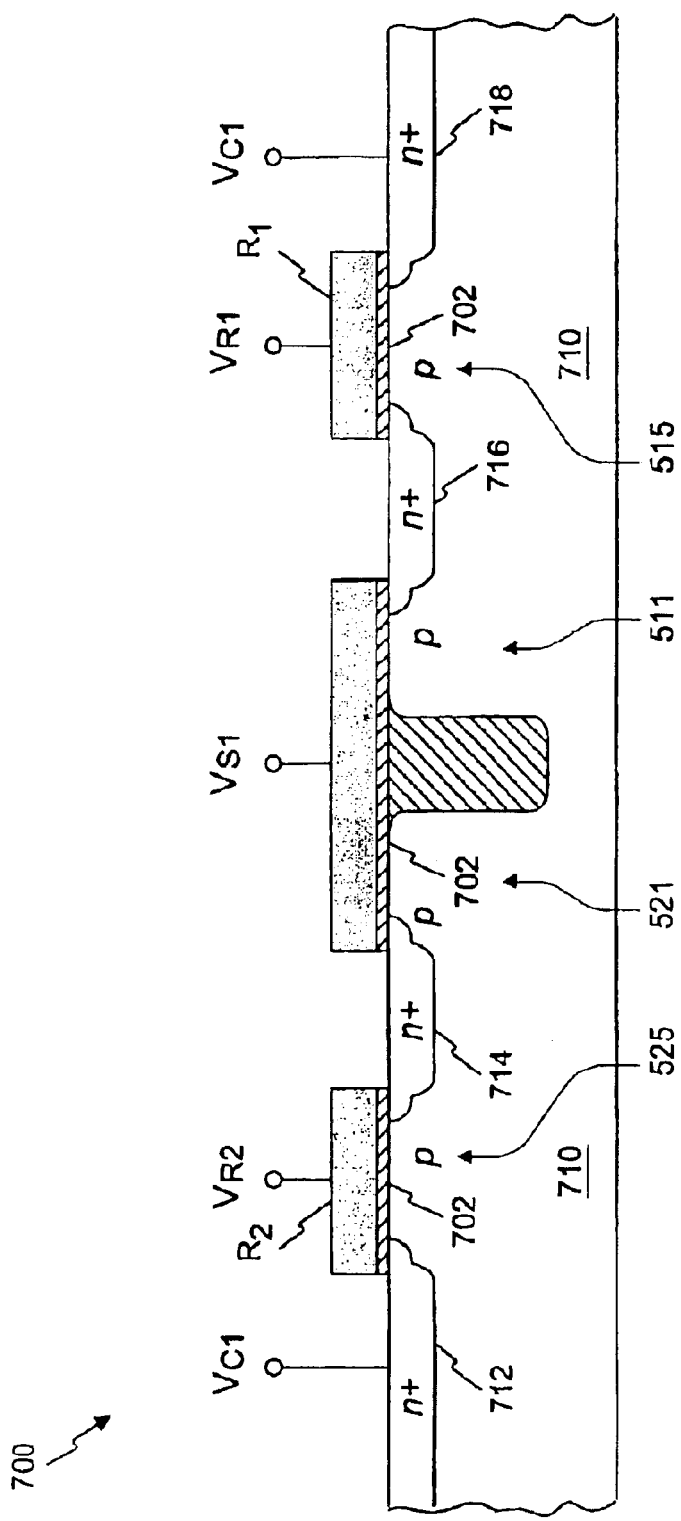
FIG. 7 is a cross-section diagram of an integrated circuit structure for the portion of the memory array corresponding to FIG. 6.
Figure 11:
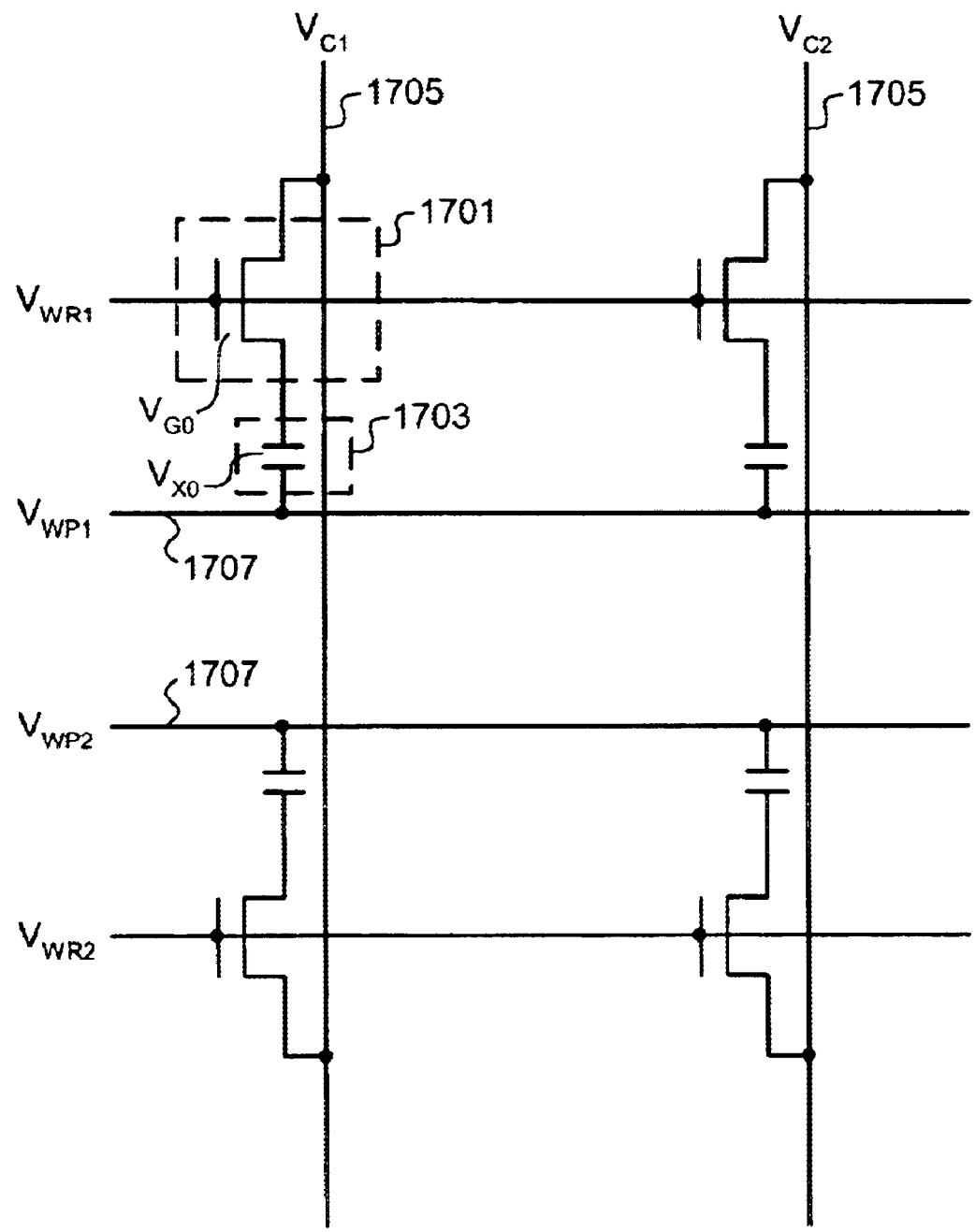
FIG. 11 is a schematic view of an alternative embodiment of a portion of a memory array.
Figure 12:
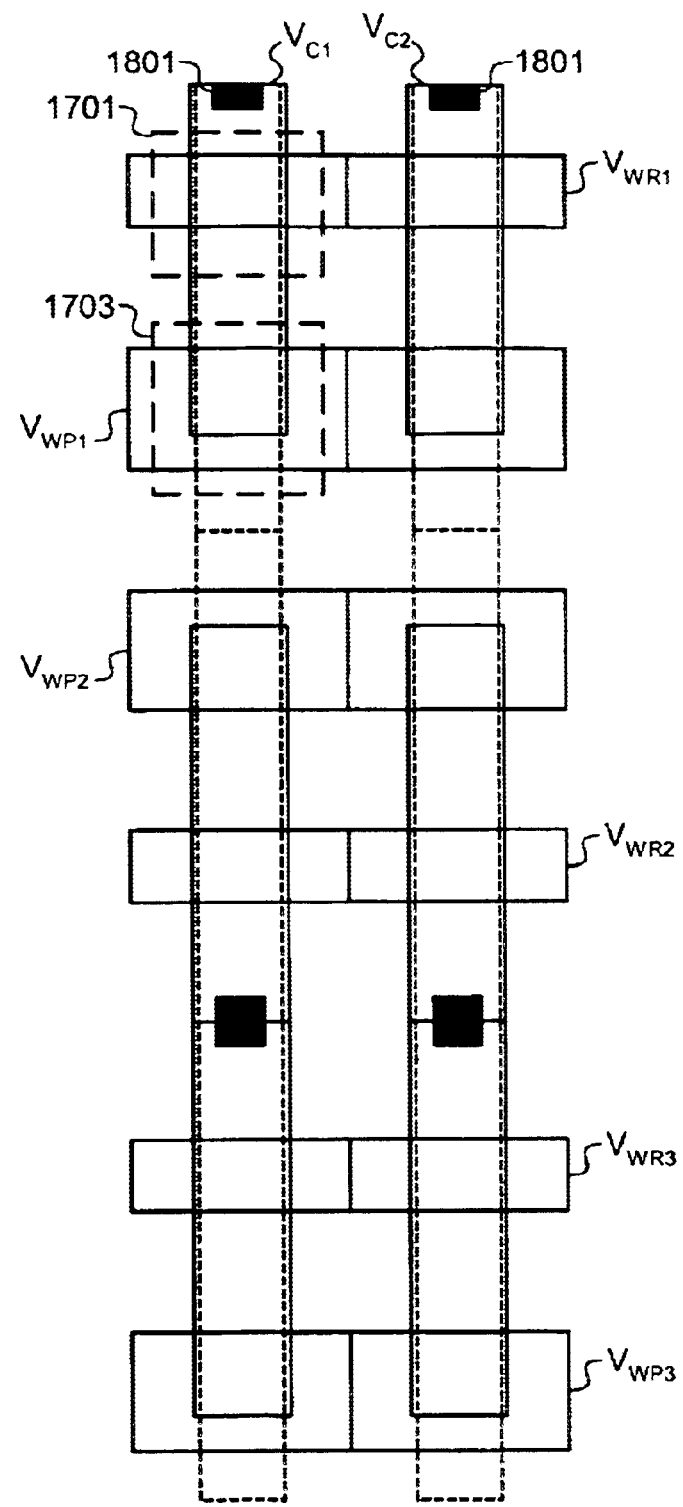
FIG. 12 is a top layout view of the memory array of FIG. 11.

FIG. 6 shows a partial layout diagram 600 for a portion of the memory array 500, and FIG. 7 presents a cross-section of an illustrative MOS integrated circuit 700 showing the principal structure aspects thereof corresponding to the paired memory cells formed by transistor-half transistor pairs 515 and 511, and 525 and 521 in accordance with the layout diagram of FIG. 5. The layout diagram of FIG. 6 is suitable for an advanced CMOS logic process, for example. The memory array 500 preferably is laid out in a grid in which the column lines such as $C_1$ and $C_2$ are orthogonal to the row lines such as $R_1$, $R_2$, $R_3$ and $R_4$ as well as source lines such as $S_1$. An n+ diffusion and active region mask containing patterns 612, 614, 622 and 624 (FIG. 6) is used to form oxide isolation structures, which include oxide trench 704 (FIG. 7), and to define the active regions such as 710 (FIG. 7), which will contain the various transistors and half-transistors of the memory array. The MOS half-transistor 511 and the MOS transistor 515 at the crosspoint of the row line $R_1$ and the column line $C_1$ and the MOS half-transistor 521 and the MOS transistor 525 at the crosspoint of the row line $R_2$ and the column line $C_1$ are formed in the p well active region 710 in the following manner. An ultra-thin gate oxide layer 702 is formed followed by a deposition and doping of polysilicon, which is patterned using a gate mask containing patterns such as $R_1$, $S_1$ and $R_2$ which serve as gates for the select transistors 515, 525, 516 and 526 and for the half-transistors 511, 521, 512 and 522. The various source and drain regions are formed by a lightly doped drain ("NLDD") process steps (implants, spacers, and n+ source/drain implants), creating the n+ regions 712, 714, 716 and 718 (FIG. 7). A contact mask including patterns 610, 616, 620 and 626 (FIG. 6) is used to form contacts to the drains 712 and 718 (FIG. 7) as well as to other drains (not shown). A metal mask includes dashed patterns labeled $C_1$ and $C_2$ (FIG. 6) for forming column lines such as $C_1$ and $C_2$, which are orthogonal to the polysilicon row lines such as $R_1$, $R_2$, $R_3$ and $R_4$ as well as the polysilicon source lines such as $S_1$. The other transistor-half transistor pairs in the memory 500 are simultaneously formed in an identical manner.

The operation of the memory array 100 is now explained with reference to the illustrative voltages shown in FIG. 8. It will be appreciated that the voltages are illustrative, and that different voltages are likely to be used in different applications or when different process technologies are used. During programming, the various memory cells in the memory array 100 are exposed to one of four possible voltage combinations, which are shown on lines 801, 802, 803 and 804 of FIG. 8. Read voltages are shown on lines 805, 806, 807 and 808.

Assume that the selected row and column ("SR/SC") is $R_1$ and $C_1$ which is intended to program the memory cell formed by transistor 115 and half-transistor 111. As shown on line 801, the voltage on the row line $R_1$ is 2.5 volts and the voltage on the source line $S_1$ is 0 volts, which is sufficient to turn on the transistor 115 and bring the drain of transistor 115 to zero volts. The voltage on the column line $C_1$ is 8.0 volts, which causes a potential difference of 8 volts across the half-transistor 111. The gate oxide 212 in the half-transistor 111 is designed to break down at this potential difference, which programs the memory cell. When the half-transistor 111 breaks down, the resulting conductive path has sufficient resistivity to prevent the gate oxide 212 of the transistor 115 from becoming degraded or breaking down. As one example, in some devices, the channel resistance of the transistor 115 is on the order of about 10 KΩ while the resistance of the broken down oxide is on the order of greater than about 100 KΩ.

With $R_1$ and $C_1$ being the selected row and column, consider the impact on the memory cell formed by transistor 116 and half-transistor 112, which is at the crosspoint of a selected row and unselected column ("SR/UC"). As shown on line 802, the voltage on the row line $R_1$ is 2.5 volts and the voltage on the source line $S_1$ is 0 volts, which is sufficient to turn on the transistor 116 and bring the drain of transistor 115 to zero volts. However, the voltage on the column line $C_2$ is 0 volts, which causes a potential difference of 0 volts across the half-transistor 112. The memory cell does not program.

With $R_1$ and $C_1$ being the selected row and column, consider the impact on the memory cell formed by transistor 121 and half-transistor 125, which is at the crosspoint of an unselected row and a selected column ("UR/SC"). As shown on line 803, the voltage on the row line $R_2$ is 0 volts and the voltage on the source line $S_1$ is 0 volts, so that the transistor 121 does not turn on and the node between the drain of the transistor 121 and the half-transistor 125 floats. The voltage on the column line $C_1$ is 8.0 volts, which causes a potential difference of less than about 5 volts across the half-transistor 125. The memory cell does not program, and the potential difference of less than about 5 volts without any current flow is not sufficient to damage or degrade the gate oxide in either the half-transistor 125 or the transistor 121.

With $R_1$ and $C_1$ being the selected row and column, consider the impact on the memory cell formed by transistor 122 and half-transistor 126, which is at the crosspoint of an unselected row and an unselected column ("UR/UC"). As shown on line 804, the voltage on the row line $R_2$ is 0 volts and the voltage on the source line $S_1$ is 0 volts, so that the transistor 122 does not turn on. The voltage on the column line $C_2$ also is 0 volts, so that no potential difference develops across the half-transistor 126. The memory cell does not program.

The memory array 100 is read in the following manner. A read select voltage of 2.5 volts is placed on the selected row ("SR") and a read column select voltage of 1.5 volts is placed on the selected column ("SC"). All other rows, which are unselected rows ("UR"), and all other columns, which are unselected columns ("UC"), are set at 0 volts. Assume that $R_1$ and $C_1$ are the selected row and column ("SR/SC") and that the memory cell formed by the transistor 115 and the half-transistor 111 is programmed. As shown on line 805, 2.5 volts (a read select voltage) are applied via row line $R_1$ to the gate of the transistor 115 and 0 volts are applied to the source via the source line $S_1$, causing current to be drawn from the column line $C_1$, which is at 1.5 volts, to indicate that the memory cell is programmed. If the memory cell is not programmed, no current would flow to indicate that the memory cell is not programmed.

No current is drawn by memory cells at crosspoints having either an unselected row or an unselected column. As shown on line 806 for the case of a selected row line and an unselected column line, 2.5 volts are applied to the gate of the transistor in the memory cell, but as 0 volts are present on the column line, no current flows. As shown on line 807 for the case of an unselected row line and a selected column line, 0 volts are applied to the gate of the transistor in the memory cell. Although 1.5 volts are present on the column line, no current flows because the transistor remains off. As shown on line 808 for the case of an unselected row line and an unselected column line, 0 volts are applied to the gate of the transistor in the memory cell and 0 volts are present on the column line, so no current flows.

The operation of the memory array 500 is now explained with reference to the voltages shown in FIGS. 9 and 10. These voltages are illustrative, and different voltages are likely to be used in different applications or when different process technologies are used. It will also be appreciated that while the voltages listed in the tables of FIGS. 8, 9 and 10 are different, the principle behind the various voltages is the same and is suggestive of the breadth of useful voltages.

Consider first the illustrative programming voltages listed in the table of FIG. 9. These voltages are appropriate where the half-transistor contains an ultra-thin gate oxide but the select transistors are input/output type devices having a gate oxide thickness greater than 50 Å. During programming, the various memory cells in the memory array 500 are exposed to one of four possible voltage combinations, which are shown on lines 901, 902, 903 and 904 of FIG. 9. Common to all voltage combinations is the value of the source line $S_1$ voltage, which is 0 volts.

Assume that the selected row and column ("SR/SC") is $R_1$ and $C_1$, which is intended to program the memory cell formed by transistor 515 and half-transistor 511. As shown on line 901, the voltage on the row line $R_1$ is 7.0 volts and the voltage on the column line $C_1$ is 7.0 volts, which places 7.0 volts on the gate and drain and is sufficient to turn on the transistor 515. The source of transistor 515 is brought to 7.0 volts less a slight voltage drop across the transistor 515, which causes a potential difference of 6.6 volts across the half-transistor 511. The gate oxide 712 in the half-transistor 511 is designed to break down at this potential difference, which programs the memory cell. When the half-transistor 511 breaks down, the resulting conductive path has sufficient resistivity to prevent the gate oxide 712 of the transistor 515 from becoming degraded or breaking down.

With $R_1$ and $C_1$ being the selected row and column, consider the impact on the memory cell formed by transistor 516 and half-transistor 512, which is at the crosspoint of a selected row and an unselected column ("SR/UC"). As shown on line 902, the voltage on the row line $R_1$ is 7.0 volts and the voltage on the column line $C_1$ is 0 volts, which places 7.0 volts on the gate and is sufficient to turn on the transistor 516 and bring the source of transistor 516 to about the voltage on the column line $C_2$, which is zero volts. Since the potential difference across the half-transistor 512 is about 0 volts, the memory cell does not program.

With $R_1$ and $C_1$ being the selected row and column, consider the impact on the memory cell formed by transistor 525 and half-transistor 521, which is at the crosspoint of an unselected row and a selected column ("UR/SC"). As shown on line 903, the voltage on the row line $R_2$ is 0 volts and the voltage on the column line $C_1$ is 7.0 volts, which places 0 volts on the gate and 7.0 volts on the drain. The transistor 525 does not turn on, although the 7.0 voltage difference between the potential on the drain and the potential on the source line $S_1$ approximately divides between the transistor 525 and the half-transistor 125 and causes less than 4 volts to appear across the oxide of the half-transistor 521. The memory cell does not program, and the potential difference of less than about 4 volts without any current flow is not sufficient to damage or degrade the gate oxide in either the half-transistor 521 or the transistor 525.

With $R_1$ and $C_1$ being the selected row and column, consider the impact on the memory cell formed by transistor 526 and half-transistor 522, which is at the crosspoint of an unselected row and an unselected column ("UR/UC"). As shown on line 904, the voltage on the row line $R_2$ is 0 volts and the voltage on the drain line $C_2$ is 0 volts, so that the transistor 526 does not turn on. The voltage on the source line $S_1$ also is 0 volts, so that no potential difference develops across the half-transistor 522. The memory cell does not program.

Consider next the illustrative programming voltages listed in the table of FIG. 10. These voltages are appropriate where both the half-transistors and the select transistors contain an ultra-thin gate oxide. During programming, the various memory cells in the memory array 500 are exposed to one of four possible voltage combinations, which are shown on lines 1001, 1002, 1003 and 1004 of FIG. 10. Common to all voltage combinations is the value of the source line $S_1$ voltage, which is minus 4.5 volts.

Assume that the selected row and column ("SR/SC") is $R_1$ and $C_1$, which is intended to program the memory cell formed by transistor 515 and half-transistor 511. As shown on line 1001, the voltage on the row line $R_1$ is 2.5 volts and the voltage on the column line $C_1$ is 2.5 volts, which places 2.5 volts on the gate and drain and is sufficient to turn on the transistor 515. The source of transistor 515 is brought to 2.5 volts less a slight voltage drop across the transistor 515, which causes a potential difference of 6.6 volts across the half-transistor 511. The gate oxide 712 in the half-transistor 511 is designed to break down at this potential difference, which programs the memory cell. When the half-transistor 511 breaks down, the resulting conductive path has sufficient resistivity to prevent the gate oxide 712 of the transistor 515 from becoming degraded or breaking down.

With $R_1$ and $C_1$ being the selected row and column, consider the impact on the memory cell formed by transistor 516 and half-transistor 512, which is at the crosspoint of a selected row and an unselected column ("SR/UC"). As shown on line 1002, the voltage on the row line $R_1$ is 2.5 volts and the voltage on the column line $C_1$ is 0 volts, which places 2.5 volts on the gate and is sufficient to turn on the transistor 516 and bring the source of transistor 516 to about the voltage on the column line $C_2$, which is zero volts. Since the potential difference across the half-transistor 512 is about 4.0 volts, the memory cell does not program.

With $R_1$ and $C_1$ being the selected row and column, consider the impact on the memory cell formed by transistor 525 and half-transistor 521, which is at the crosspoint of an unselected row and a selected column ("UR/SC"). As shown on line 1003, the voltage on the row line $R_2$ is 0 volts and the voltage on the column line $C_1$ is 2.5 volts, which places 0 volts on the gate and 2.5 volts on the drain. The transistor 525 does not turn on, although the 6.5 volt difference between the potential on the drain and the potential on the source line $S_1$ approximately divides between the transistor 525 and the half-transistor 125 and causes less than about 4 volts to appear across the oxide of the half-transistor 521. The memory cell does not program, and the potential difference of less than about 4 volts without any current flow is not sufficient to damage or degrade the gate oxide in either the half-transistor 521 or the transistor 525.

With $R_1$ and $C_1$ being the selected row and column, consider the impact on the memory cell formed by transistor 526 and half-transistor 522, which is at the crosspoint of an unselected row and an unselected column ("UR/UC"). As shown on line 1004, the voltage on the row line $R_2$ is 0 volts and the voltage on the drain line $C_2$ is 0 volts, so that the transistor 526 does not turn on. Since the voltage on the source line $S_1$ is minus 4.5 volts, the potential difference that develop across the half-transistor 522 is less than about 4 volts. The memory cell does not program, and the potential difference of less than about 4 volts without any current flow is not sufficient to damage or degrade the gate oxide in either the half-transistor 522 or the transistor 526.

Regardless of whether the programming voltages of the table of FIG. 9 or the table of FIG. 10 are used, the memory array 500 is read in the following manner. A read select voltage of 2.5 volts is placed on the selected row ("SR") and a read column select voltage of 1.5 volts is placed on the selected column ("SC"). All other rows, which are unselected rows ("UR"), and all other columns, which are unselected columns ("UC"), are set at 0 volts. Assume that $R_1$ and $C_1$ are the selected row and column ("SR/SC") and that the memory cell formed by the transistor 515 and the half-transistor 511 is programmed. As shown on lines 905 and 1005, 2.5 volts (a read select voltage) are applied via row line $R_1$ to the gate of the transistor 515 and 1.5 volts are applied to the drain via the column line $C_1$, causing current to be drawn from the column line $C_1$ to indicate that the memory cell is programmed. If the memory cell is not programmed, no current would flow to indicate that the memory cell is not programmed.

No current is drawn by memory cells at crosspoints having either an unselected row or an unselected column. As shown on lines 906 and 1006 for the case of a selected row line and an unselected column line, 2.5 volts are applied to the gate of the transistor in the memory cell, but as 0 volts are present on the column line, no current flows. As shown on lines 907 and 1007 for the case of an unselected row line and a selected column line, 0 volts are applied to the gate of the transistor in the memory cell. Although 1.5 volts are present on the column line, no current flows because the transistor remains off. As shown on lines 908 and 1008 for the case of an unselected row line and an unselected column line, 0 volts are applied to the gate of the transistor in the memory cell and 0 volts are present on the column line, so no current flows.

The design of the memory cells and arrays described above and shown in FIGS. 1–10 provide a significant advantage of cost and performance over prior art memory cells. However, as seen above, during programming, a relatively large programming voltage (typically 6 or more) is applied to the oxide of the half transistor. For those rows that are not selected for programming, i.e., the select transistors for unprogrammed cells, a relatively large voltage will be present across the oxide of the select transistors not programmed if the cell has been previously programmed. This may damage (breakdown) the oxide of those select transistors. In order to combat this problem, a thicker gate oxide for the select transistor (on the order of 70 angstroms) may be used. However, the use of a thicker gate oxide results in large cell size for the memory cell.

By modifying the layout and programming voltages, the issues raised above may be resolved. Specifically, in an alternative embodiment described below, the gate oxide of the select transistor may also be made to be an ultra-thin dielectric, same as the half-transistor storage element. This is because the select transistors of unselected memory cells do not experience a high voltage across the gate oxide. Turning to FIGS. 17 and 18, a schematic view and top layout view of an alternative embodiment of the present invention can be seen. In this embodiment, a select transistor 1701 is controlled by a signal $V_{WR1}$ (the subscript referring to "Wordline Read No. 1"). Other rows of memory cells have their select transistors controlled by signals $V_{WRN}$, where N varies from 1 to N (the total number of rows in the memory array). The signals $V_{WRN}$ are carried on what are also referred to as row select lines.

The source of the select transistor 1701 is connected to a column select line 1705 that provides a voltage $V_{C1}$. Other columns of memory cells have the sources of the select transistors controlled by signals $V_{CM}$, where M varies from 1 to M (the total number of columns in the memory array).

The drain of the select transistor 1701 is connected to one terminal of a capacitor 1703. In one embodiment, the capacitor 1703 is a MOS capacitor formed by an implant region, a gate oxide, and a polysilicon layer. In one embodiment, the drain of the select transistor 1701 is connected to the implant region of the MOS capacitor 1703. The gate oxide of the capacitor is used as the storage element, e.g., the gate oxide can be selectively broken down for programming as described in detail above. The polysilicon layer of the MOS capacitor 1703 is connected to a programming line 1707 that provides a voltage $V_{WP1}$. Other rows of memory cells have the polysilicon layer of the MOS capacitor 1703 connected to signals $V_{WPN}$, where N varies from 1 to N (the total number of rows in the memory array). The signals $V_{WPN}$ are carried on what are also referred to as row program lines.

The top layout view of the memory array can be seen in FIG. 18. In this tope view, six memory cells are shown. Like structures are designated with like numbers in both FIGS. 17 and 18. Thus, the select transistor 1701 in FIG. 18 is shown as a polysilicon layer ($V_{WR1}$) formed between source and drain implants. FIG. 18 also shows contacts 1801 that connect the source of the select transistor 1701 to a column select line.

The operation of the memory cell of FIGS. 17 and 18 is now explained with reference to the illustrative voltages shown in the table below:

|  |  | $V_C$ | $V_{WP}$ | $V_{WR}$ | $V_{XO}$ | $V_{GO}$ | Program |
|---|---|---|---|---|---|---|---|
| Program | SC/SR | 0 | 5.5 | 2 | 5.5 | 2 | Yes |
|  | SC/UR | 0 | 0 | 0 | 0 | 0 | No |
|  | UC/SR | 2 | 5.5 | 2 | 3.5 | 0 | No |
|  | UC/UR | 2 | 0 | 0 | 0 | 2 | No |

|  |  | $V_C$ | $V_{WP}$ | $V_{WR}$ | $V_{XO}$ | $V_{GO}$ | Sense Current |
|---|---|---|---|---|---|---|---|
| Read | SC/SR | 1.2 | 0 | 1.2 |  |  | Yes |
|  | SC/UR | 1.2 | 0 | 0 |  |  | No |
|  | UC/SR | 0 | 0 | 0 |  |  | No |
|  | UC/UR | 0 | 0 | 0 |  |  | No |

It will be appreciated that the voltages are illustrative, and that different voltages are likely to be used in different applications or when different process technologies are used. During programming, the various memory cells in the memory array are exposed to one of four possible voltage combinations, which correspond to: (1) the cell that is the intersection of the Selected Column (SC) and Selected Row (SR); (2) the cells that are not in the selected column (referred to as unselected column or "UC"), but are in the selected row; (3) the cells that are not in the selected row (referred to as unselected row or "UR"), but are in the selected column; and (4) the cells that are not in the selected row and not in the selected column.

For the cell in the selected row and column ("SR/SC"), the voltage on the row line $V_{WR}$ is 2 volts, the voltage on the column select line $V_C$ is 0 volts, and the voltage on the programming line $V_{WP}$ 5.5 volts. This causes a potential difference ($V_{XO}$) of 5.5 across the oxide of the capacitor 1703. The capacitor oxide in the capacitor is designed to break down at this potential difference, which programs the memory cell. Further, the voltage across the oxide of the select transistor, designated as $V_{GO}$ has a maximum of 2 volts. This prevents breakdown of the oxide of the select transistor.

Next, we consider the impact on a memory cell that is at the crosspoint of a selected row and unselected column ("SR/UC"). As shown in the table above, the voltage on the row line $V_{WR}$ is 2 volts, the voltage on the column select line $V_C$ is 2 volts, and the voltage on the programming line $V_{WR}$ 5.5 volts. This will result in a voltage $V_{XO}$ of 3.5 volts across the oxide of the capacitor. This will not break down the oxide, and thus, the cell is not programmed. Further, the maximum voltage $C_{GO}$ across the oxide of the select transistor is 2 volts. This allows for the use of an ultra thin gate oxide for the select transistor.

Next, consider the impact on the memory cell that is at the crosspoint of an unselected row and a selected column ("UR/SC"). As shown in the table above, the voltage on the row line $V_{WR}$ is 0 volts, the voltage on the column select line $V_C$ is 0 volts, and the voltage on the programming line $V_{WP}$ 0 volts. This will result in a voltage $V_{XO}$ of 0 volts across the oxide of the capacitor. This will not break down the oxide, and thus, the cell is not programmed. Further, there is no voltage $V_{GO}$ across the oxide of the select transistor. Again, this allows for the use of an ultra thin gate oxide for the select transistor.

Next, consider the impact on the memory cell that is at the crosspoint of an unselected row and an unselected ("UR/UC"). As shown in the table above, the voltage on the row line $V_{WR}$ is 0 volts, the voltage on the column select line $V_C$ is 2 volts, and the voltage on the programming line $V_{WP}$ 0 volts. This will result in a voltage $V_{XO}$ of 0 volts across the oxide of the capacitor. This will not break down the oxide, and thus, the cell is not programmed. Further, the maximum $V_{GO}$ across the oxide of the select transistor is 2 volts. Again, this allows for the use of an ultra thin gate oxide for the select transistor.

The memory can be read in the following manner. A read select voltage of 1.2 volts is placed on the selected row ("SR") and a read column select voltage of 1.2 volts is placed on the selected column ("SC"). All other rows, which are unselected rows ("UR"), and all other columns, which are unselected columns ("UC"), are set at 0 volts. Assume that the memory cell at the crosspoint of the selected column and selected row is programmed. A 1.2 volts (a read select voltage) is applied via row line $V_{WR}$ to the gate of the select transistor 1701 and 1.2 volts is applied to the source via the column line $V_C$. If the cell is programmed, current would be drawn from the column line $V_C$, which is at 1.2 volts. If the memory cell is not programmed, no current would flow to indicate that the memory cell is not programmed.

Testing of the Memory Cell

In order to ensure that the gate oxide (also referred to as a thin oxide) underlying the half-transistors or capacitors (e.g., the data storage elements) is of sufficient quality for programming, in accordance with the present invention, each of the memory cells of a memory array may be tested. The testing is done by applying a voltage across the gate oxide of the data storage element and measuring the current flow.

If one or more memory cells are found to be defective, then redundant columns or rows of memory cells may be used to compensate. Further, if an inordinate number of memory cells are defective, then the entire memory array may be rejected.

The present invention uses a short duration Fowler-Nordheim tunneling current to test the gate oxide. In one embodiment, where the memory cell is made using a 0.18 micron process, the gate oxide is formed to about 32 angstroms. In order to program the memory cell, 8 or more volts are applied to cause a programming current of 30–200 microamps.

However, in accordance with the present invention, the gate oxide is tested by applying less than the programming voltage for a short pulse. In one embodiment, the test voltage is 6–7 volts for the device described above. The test voltage is applied in the range of 10 nanoseconds to a few microseconds (e.g. 5 microseconds). The test voltage is applied to each selected memory cell in the same manner as that cell would be programmed, except that a lesser voltage is applied to the gate of the data storage element. This applied test voltage across the gate oxide will cause a Fowler-Nordheim tunneling current ranging from a few microamps to 20 microamps to travel through the gate oxide. This amount of current is insufficient to program the memory cell. The current range will vary as the thickness of the gate oxide and other characteristics of the memory cell vary. However, in general, the current should be less than 50 microamps.

By measuring the Fowler-Nordheim tunneling current to make sure it falls within established parameters for the particular memory cell, it can be determined that the gate oxide is not too thick or not too thin. The current can be measured using the on-chip current sensing circuits normally formed on the memory array integrated circuit that is typically used during the read operation. This type of non-destructive testing can ensure the programmability of the memory cell and array.

Figure 13:
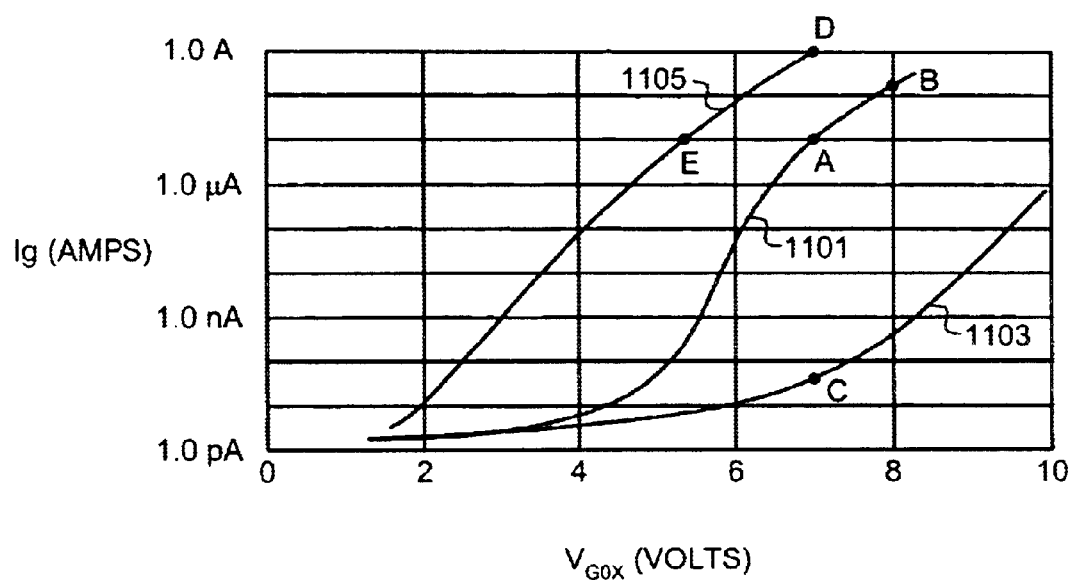
FIG. 13 is a graph illustrating various current curves during testing of a normal memory cell and two defective memory cells.

Turning to FIG. 13, an exemplary graph illustrating the principle of the present invention can be seen. In this graph, applied voltage across the gate oxide ($V_{gox}$) is along the x-axis and expressed in terms of volts. The Fowler-Nordheim tunneling current is measured on the y-axis in amperes. Note that each division in the y-axis indicates one order of magnitude. Thus, the graph's y-axis ranges from one picoampere to one ampere.

The line 1101 shows current measured as a function of voltage applied to the gate oxide for a "normal" memory cell. This is referred to as an operable memory cell. At point A, where 7 volts is applied, the Fowler-Nordheim tunneling current is seen to be approximately 10 microamps. The testing voltage of 7 volts in this particular embodiment should be a very short pulse, on the order of 0.1 microseconds. This ensures that the gate oxide is not damaged (e.g. inadvertently programmed). It can be appreciated that the time duration of the short pulse is dependent upon the specific parameters of the memory cell and may range up to 5 microseconds, but more likely to be less than 1 microsecond. The amount of voltage applied during the test and the time duration of the voltage must be formulated to balance the danger of inadvertently damaging the gate oxide with the need to have a sufficient amount of Fowler-Nordheim tunneling current to be measurable.

As a point of reference, at point B, where a programming of 8 volts is applied, the current flowing through the gate oxide is a result of gate oxide breakdown and reaches a magnitude of hundreds of microamps. The memory cell can be programmed at this voltage in a few to tens of microseconds.

The line 1103 shows the voltage-current characteristic of a gate oxide that is too thick or otherwise resistant to breakdown. As seen, with the test voltage of 7 volts applied across the gate oxide, the resultant current is shown at point C. This current, in the example of FIG. 13, is less than 1.0 nanoamps. This amount of current is likely to be undetectable, and clearly less than the expected 10 microamp range for a "normal" memory cell. The amount of current for a normal memory cell is referred to as the nominal current level. Thus, this test result indicates that the memory cell is defective.

Conversely, line 1105 shows the voltage-current characteristic of a gate oxide that is too thin or otherwise relatively conductive to current. As seen, with the test voltage of 7 volts applied across the gate oxide, the resultant current is shown at point D. This current, in the example of FIG. 13, is on the order of one amp. This amount of current is clearly more than the expected 10 uA range for a "normal" memory cell. In other words, the current flow in a too thin gate oxide is greater than the nominal current level. Thus, this test result indicates that the memory cell is defective.

In one alternative implementation for screening for defects related to an overly thin gate oxide, a lower test voltage may be used in the range of 4 to 5.5 volts detect a point D failure. If the sense circuit can detect a current of few uA, such as at point E when placed under 4–5.5 volts, then this is considered a defective cell. Indeed, the voltage used to test for overly thin gate oxides may be varied, but the fact that the detected current is more than the expected nominal current level for that particular applied voltage indicates a defective cell. The amount of current flowing through a too thin gate oxide is referred to as a fast bit current level.

Further, the magnitude of the test voltage can be selected to match the sense circuit for measuring current. For example, if the sense circuit is optimized for detecting currents in the 1–10 uA range, then a voltage of 4–5.5 volts should be used. However, if the specific variations in the design of the memory cell results in a higher or lower necessary voltage to program or read the memory cell, then the test voltage will need to be adjusted to allow appropriate sensing by the sense circuit. Therefore, the test voltage is selected to provide a fast bit current level that is easily measurable by the sense circuit.

In summary, a wafer sort program can set two screening short pulse voltages, one at 4 to 5.5V to detect for thin oxide bits (referred to as "fast bits"), and a second higher voltage 7V to 8V to detect for thick oxide bits (referred to as "slow bits"). These two tests can be used to screen out the abnormal bits (memory cells).

By performing the current testing protocol described above, memory cells can be confirmed as being viable if the Fowler-Nordheim tunneling current falls within expected parameters.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art.

For example, the various voltages set forth in the various examples are only illustrative, since one has some discretion as to the precise voltage to select within a range of voltages, and the voltages are in any event dependent on the device characteristics. The terms row wordline and column bitline have been used to describe types of lines commonly used in memories, but some memories may have alternatives thereto. These and other variations and modifications of the embodiments disclosed herein may be made without departing from the scope and spirit of the invention.

What is claimed is:

1. In a programmable memory cell useful in a memory array having select and access lines, the memory cell comprising a select transistor coupled in series with a data storage element between two access lines, the select transistor further having a gate coupled to one of the select lines, and the data storage element comprising an ultra-thin dielectric for physical storage of data, a method for testing said memory cell comprising:

applying a test voltage across said ultra-thin dielectric, said test voltage less than the breakdown voltage of said ultra-thin dielectric;

measuring the amount of current flowing through said ultra-thin dielectric when said test voltage is applied; and determining that said memory cell is inoperable if said current flow is less than a nominal current level.

2. The method of claim 1 wherein the current flow being measured is the Fowler-Nordheim tunneling current through said ultra-thin dielectric.

3. The method of claim 1 wherein the test voltage is applied for between 10 nanoseconds and 5 microseconds.

4. The method of claim 1 further including the determining if said current flow is less than an upper predetermined threshold.

5. The method of claim 4 wherein said upper predetermined threshold is 50 microamps or less.

6. In a programmable memory cell useful in a memory array having select and access lines, the memory cell comprising a select transistor coupled in series with a data storage element between two access lines, the select transistor further having a gate coupled to one of the select lines, and the data storage element comprising an ultra-thin dielectric for physical storage of data, a method for testing said memory cell comprising:

applying a test voltage across said ultra-thin dielectric, said test voltage less than the breakdown voltage of said ultra-thin dielectric;

measuring the amount of current flowing through said ultra-thin dielectric when said test voltage is applied; and determining that said memory cell is operable if said current flow is within a predetermined range.

7. The method of claim 6 wherein the current flow being measured is the Fowler-Nordheim tunneling current through said ultra-thin dielectric.

8. The method of claim 6 wherein the test voltage is applied for between 10 nanoseconds and 5 microseconds.

9. In a programmable memory cell useful in a memory array having select and access lines, the memory cell comprising a select transistor coupled in series with a data storage element between two access lines, the select transistor further having a gate coupled to one of the select lines, and the data storage element comprising an ultra-thin dielectric for physical storage of data, a method for testing said memory cell comprising:

applying a test voltage across said ultra-thin dielectric, said test voltage less than the breakdown voltage of said ultra-thin dielectric;

measuring the amount of current flowing through said ultra-thin dielectric when said test voltage is applied; and determining that said memory cell is operable if said current flow is less than a fast bit current level.

10. The method of claim 9 wherein the current flow being measured is the Fowler-Nordheim tunneling current through said ultra-thin dielectric.

11. The method of claim 9 wherein said test voltage is between 4–5.5 volts.

12. The method of claim 9 wherein the test voltage is selected to provide a fast bit current level that is suitable for measurement by a sense circuit.

13. In a programmable memory cell useful in a memory array having select and access lines, the memory cell comprising a select transistor coupled in series with a data storage element between two access lines, the select transistor further having a gate coupled to one of the select lines, and the data storage element comprising an ultra-thin dielectric for physical storage of data, a method for testing said memory cell comprising:

applying a test voltage across said ultra-thin dielectric, said test voltage less than the breakdown voltage of said ultra-thin dielectric;

measuring the amount of current flowing through said ultra-thin dielectric when said test voltage is applied; and determining that said memory cell is inoperable if said current flow is higher than a nominal current level.

14. The method of claim 13 wherein the current flow being measured is the Fowler-Nordheim tunneling current through said ultra-thin dielectric.

* * * * *